US012490403B2

(12) United States Patent
Kuo et al.

(10) Patent No.: US 12,490,403 B2
(45) Date of Patent: Dec. 2, 2025

(54) HEAT DISSIPATION SYSTEM AND ANNULAR RADIATOR

(71) Applicant: Wistron Corporation, New Taipei (TW)

(72) Inventors: Shu-Hao Kuo, New Taipei (TW); Jun-Ting Ke, New Taipei (TW)

(73) Assignee: WISTRON CORPORATION, New Taipei (TW)

( * ) Notice: Subject to any disclaimer, the term of this patent is extended or adjusted under 35 U.S.C. 154(b) by 312 days.

(21) Appl. No.: 18/464,613

(22) Filed: Sep. 11, 2023

(65) Prior Publication Data

US 2025/0008681 A1  Jan. 2, 2025

(30) Foreign Application Priority Data

Jun. 29, 2023  (TW) .................................. 112124412

(51) Int. Cl.
*H05K 7/20* (2006.01)

(52) U.S. Cl.
CPC ..... *H05K 7/20154* (2013.01); *H05K 7/20145* (2013.01)

(58) Field of Classification Search
CPC ............ H05K 7/20154; H05K 7/20145; H01L 23/3672
USPC .................................................... 165/104.33
See application file for complete search history.

(56) References Cited

U.S. PATENT DOCUMENTS

| 8,430,153 | B2* | 4/2013 | Xu ......................... H01L 23/427 165/185 |
| 9,513,059 | B2* | 12/2016 | Maurer ................. F28D 7/0058 |
| 10,436,219 | B2* | 10/2019 | Elsner ....................... F28D 9/04 |
| 2005/0257914 | A1* | 11/2005 | Huang ....................... F28F 1/16 257/E23.103 |
| 2011/0100609 | A1* | 5/2011 | Tang ................... H05K 7/20318 165/185 |
| 2014/0034278 | A1* | 2/2014 | Lin ........................... F28F 1/16 165/185 |

FOREIGN PATENT DOCUMENTS

| TW | M459436 U | 8/2013 |
| TW | I438391 B | 5/2014 |
| TW | M499745 U | 4/2015 |
| TW | I513400 B | 12/2015 |
| TW | I763256 B | 5/2022 |

OTHER PUBLICATIONS

Examination report dated Dec. 11, 2023, listed in related Taiwan patent application No. 112124412.

\* cited by examiner

*Primary Examiner* — Steve S Tanenbaum
(74) *Attorney, Agent, or Firm* — McClure, Qualey & Rodack, LLP

(57) ABSTRACT

A heat dissipation system includes an annular radiator and two flow guide baffles. Each flow guide baffle has a connected end and a free end opposite to each other. The connected ends of the two flow guide baffles are connected to the annular radiator. The two flow guide baffles and the annular radiator surround a heat source area. The heat source area has a lateral opening. The lateral opening is formed by the free ends of the two flow guide baffles, and is located in two sides of the heat source area with the annular radiator respectively.

20 Claims, 12 Drawing Sheets

HEAT DISSIPATION SYSTEM AND ANNULAR RADIATOR

CROSS-REFERENCE TO RELATED APPLICATION

This non-provisional application claims priority under 35 U.S.C. § 119(a) to patent application No. 112124412 filed in Taiwan, R.O.C. on Jun. 29, 2023, the entire contents of which are hereby incorporated by reference.

BACKGROUND

Technical Field

The present disclosure relates to a heat dissipation system, and in particular to a heat dissipation system and an annular radiator.

Related Art

With the development of science and technology, a central processing unit (CPU) on a circuit board module is progressing gradually, the efficiency of the CPU is improved, and the amount of heat to be dissipated is increasing accordingly.

In general, a radiator may be disposed near a main heating element in the circuit board module, and the heat dissipation efficiency of the radiator is proportional to the volume of the radiator. Specifically, the heat dissipation area of the radiator is generally increased by increasing a fin number of heat dissipation fins, so as to improve the heat dissipation efficiency. In order to maintain an airflow channel between two adjacent heat dissipation fins, the volume of the radiator will be increased with the increase of the fin number. However, with the development of high efficiency and multiplexing of an electronic device, a heating element (such as a CPU) on the circuit board module will generate higher heat due to the improvement of efficiency. However, space provided by the circuit board module for the arrangement of elements will not be increased. Therefore, it is difficult to improve the heat dissipation efficiency by enlarging the volume of the radiator, and to further eliminate higher heat.

In the limited arrangement space, in order to improve the heat dissipation efficiency of the radiator, the airflow channel between two adjacent heat dissipation fins must be reduced to arrange more heat dissipation fins. In other words, although the heat dissipation area is increased by increasing the fin number of the heat dissipation fins in the limited space, a larger flow resistance will be generated. On the contrary, although the flow resistance is reduced by reducing the fin number of the heat dissipation fins, the heat dissipation area will also be reduced. Therefore, when the heat dissipation area and the flow resistance change reversely, it is difficult to determine whether the heat dissipation efficiency of the radiator is increased or reduced. Therefore, in the limited arrangement space, the heat dissipation area of some radiators is increased only with curved heat dissipation fins (from a top view), so as to reduce the width reduction of an air duct and greatly affect the flow resistance.

SUMMARY

However, when viewed from a side view, the heat dissipation fins of these radiators still extend in a straight line rather than a curve. That is, an air duct path perpendicular to the circuit board module of these heat dissipation fins extending as a curve from a top view is still unchanged. When the air duct path is unchanged, the flow rate remains roughly unchanged. Therefore, the heat dissipation efficiency can be improved with limitation.

In view of this, the present disclosure provides a heat dissipation system and an annular radiator, so as to solve the problem that the heat dissipation efficiency is insufficient due to the improvement of the efficiency of a heating element, thereby increasing the heat dissipation efficiency more efficiently and/or pertinently increasing the heat dissipation efficiency for a specific heat source under the condition that the overall appearance size is roughly unchanged.

In some embodiments, a heat dissipation system includes an annular radiator and two flow guide baffles. Each flow guide baffle has a connected end and a free end opposite to each other. The connected ends of the two flow guide baffles are connected to the annular radiator. The two flow guide baffles and the annular radiator surround a heat source area. The heat source area has a lateral opening. The lateral opening is formed by the free ends of the two flow guide baffles, and is located in two sides of the heat source area with the annular radiator respectively.

In some embodiments, the foregoing annular radiator includes a heat conduction body, a plurality of heat dissipation fins, and a plurality of heat conduction branches. The plurality of heat dissipation fins and the plurality of heat conduction branches are arranged radially and connected to a peripheral surface of the heat conduction body. Each heat conduction branch has a first end and a second end opposite to each other. The first end of each heat conduction branch is connected to the peripheral surface of the heat conduction body, and the connected ends of the two flow guide baffles are connected to the second ends of two heat conduction branches among the plurality of heat conduction branches respectively.

In some embodiments, the foregoing annular radiator includes a heat conduction body, a plurality of heat dissipation fins, and a plurality of heat conduction branches. The plurality of heat dissipation fins and the plurality of heat conduction branches are arranged radially and connected to a peripheral surface of the heat conduction body. Each heat conduction branch has a first end and a second end opposite to each other. The first end of each heat conduction branch is connected to the peripheral surface of the heat conduction body, and the connected ends of the two flow guide baffles are connected to the second ends of two heat conduction branches among the plurality of heat conduction branches respectively.

In some embodiments, the first ends of the foregoing two heat conduction branches respectively connected to the connected ends of the two flow guide baffles are connected to opposite sides of the heat conduction body respectively.

In some embodiments, the foregoing plurality of heat dissipation fins is divided into a first fin group and a second fin group by a connecting line of the connected ends of the two flow guide baffles. The first fin group is adjacent to the heat source area, and a total heat dissipation area of the first fin group is smaller than a total heat dissipation area of the second fin group.

In some embodiments, an interval between any two adjacent heat dissipation fins in the foregoing first fin group is greater than an interval between any two adjacent heat dissipation fins in the second fin group.

In some embodiments, the connected ends of the foregoing two flow guide baffles are connected to opposite sides of the annular radiator respectively, and a fin number of the first fin group is smaller than a fin number of the second fin group.

In some embodiments, an interval between any two adjacent heat dissipation fins in the foregoing first fin group is greater than an interval between any two adjacent heat dissipation fins in the second fin group.

In some embodiments, the connected ends of the foregoing two flow guide baffles are connected to opposite sides of the annular radiator respectively, and a fin number of the first fin group is smaller than a fin number of the second fin group.

In some embodiments, a fin length of the foregoing first fin group is smaller than a fin length of the second fin group.

In some embodiments, the total heat dissipation area of the foregoing first fin group is smaller than or equal to 80% of the total heat dissipation area of the second fin group.

In some embodiments, the foregoing plurality of heat dissipation fins is divided into a first fin group and a second fin group by the two flow guide baffles. The first fin group is adjacent to the heat source area. An interval between any two adjacent heat dissipation fins in the first fin group is greater than an interval between any two adjacent heat dissipation fins in the second fin group, and a fin length of the first fin group is greater than a fin length of the second fin group.

In some embodiments, a fin height of the foregoing plurality of heat dissipation fins is smaller than a baffle height of the flow guide baffles.

In some embodiments, a distance between the foregoing flow guide baffles and the circuit board is greater than or equal to 0 mm and less than or equal to 0.5 mm.

In some embodiments, a difference between the fin height of the foregoing plurality of heat dissipation fins and a height of the heat conduction body is greater than or equal to 0 mm.

In some embodiments, an annular radiator includes a heat conduction body and a plurality of heat dissipation fins. The plurality of heat dissipation fins is arranged radially and connected to a peripheral surface of the heat conduction body. The plurality of heat dissipation fins is divided into a first fin group and a second fin group, and an interval between any two adjacent heat dissipation fins in the first fin group is greater than an interval between any two adjacent heat dissipation fins in the second fin group.

In some embodiments, a fin number of the foregoing first fin group is smaller than a fin number of the second fin group.

In some embodiments, a fin length of each heat dissipation fin in the foregoing first fin group is equal to a fin length of each heat dissipation fin in the second fin group.

In some embodiments, the foregoing plurality of heat dissipation fins is divided into the first fin group and the second fin group by an extension line perpendicular to and passing through the heat conduction body.

In some embodiments, the foregoing annular radiator is sandwiched between a fan and a circuit board, and the circuit board in the foregoing heat source area is provided with a plurality of heating elements.

In summary, the annular radiator and the heat dissipation system in any embodiment can provide good heat dissipation efficiency without increasing the overall size of the radiator. In some embodiments, the annular radiator is sandwiched between the fan and the circuit board to provide flow field control, so as to guide a flow field to the heat source area. In some embodiments, the annular radiator may be applied to the circuit board and can provide low-flow-resistance heat dissipation fins adjacent to the heat source area, so as to increase the flow rate of a guide element (namely, an airflow channel between two adjacent heat dissipation fins).

DETAILED DESCRIPTION

It is to be noted that the terms "first" and "second" are only used for describing purposes and cannot be understood as indicating or implying relative importance.

Also, in this specification, a "free end" of an element refers to an end of the element to which another element is not connected (as viewed from a top view). A "connected end" of an element refers to an end of the element to which another element is physically connected (as viewed from a top view).

Figure 1:
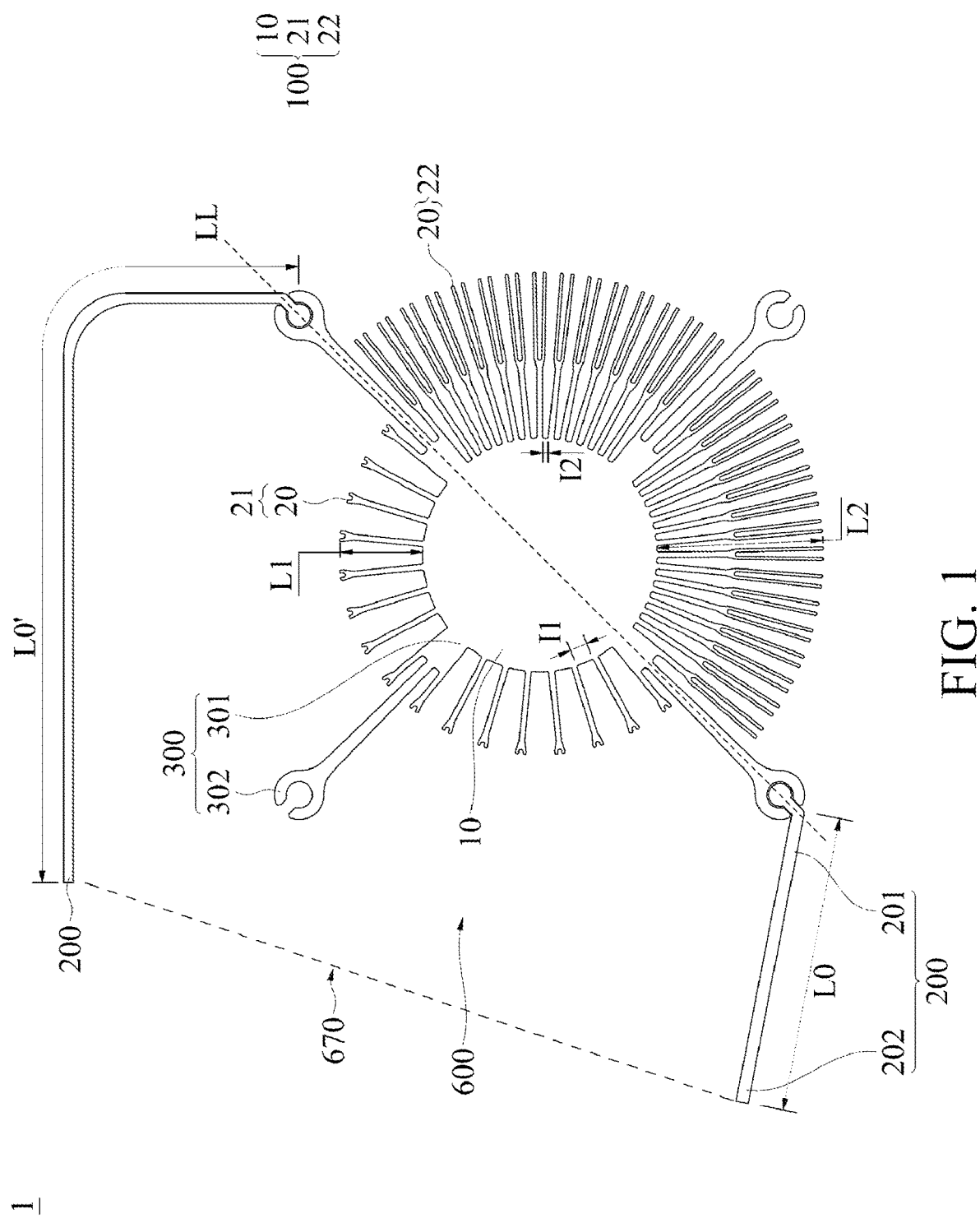
FIG. 1 is a top view of a heat dissipation system according to an embodiment.

Reference is made to FIG. 1. A heat dissipation system 1 includes an annular radiator 100 and two flow guide baffles 200. Each flow guide baffle 200 has a connected end 201 and a free end 202, and the connected end 201 and the free end 202 are opposite to each other. The connected ends 201 of the two flow guide baffles 200 are connected to the annular radiator 100. The two flow guide baffles 200 and the annular radiator 100 surround a heat source area 600, and the heat source area 600 has a lateral opening 670. The lateral opening 670 is formed by the free ends 202 of the two flow guide baffles 200, and is located in two sides of the heat source area 600 with the annular radiator 100 respectively.

Figure 3:
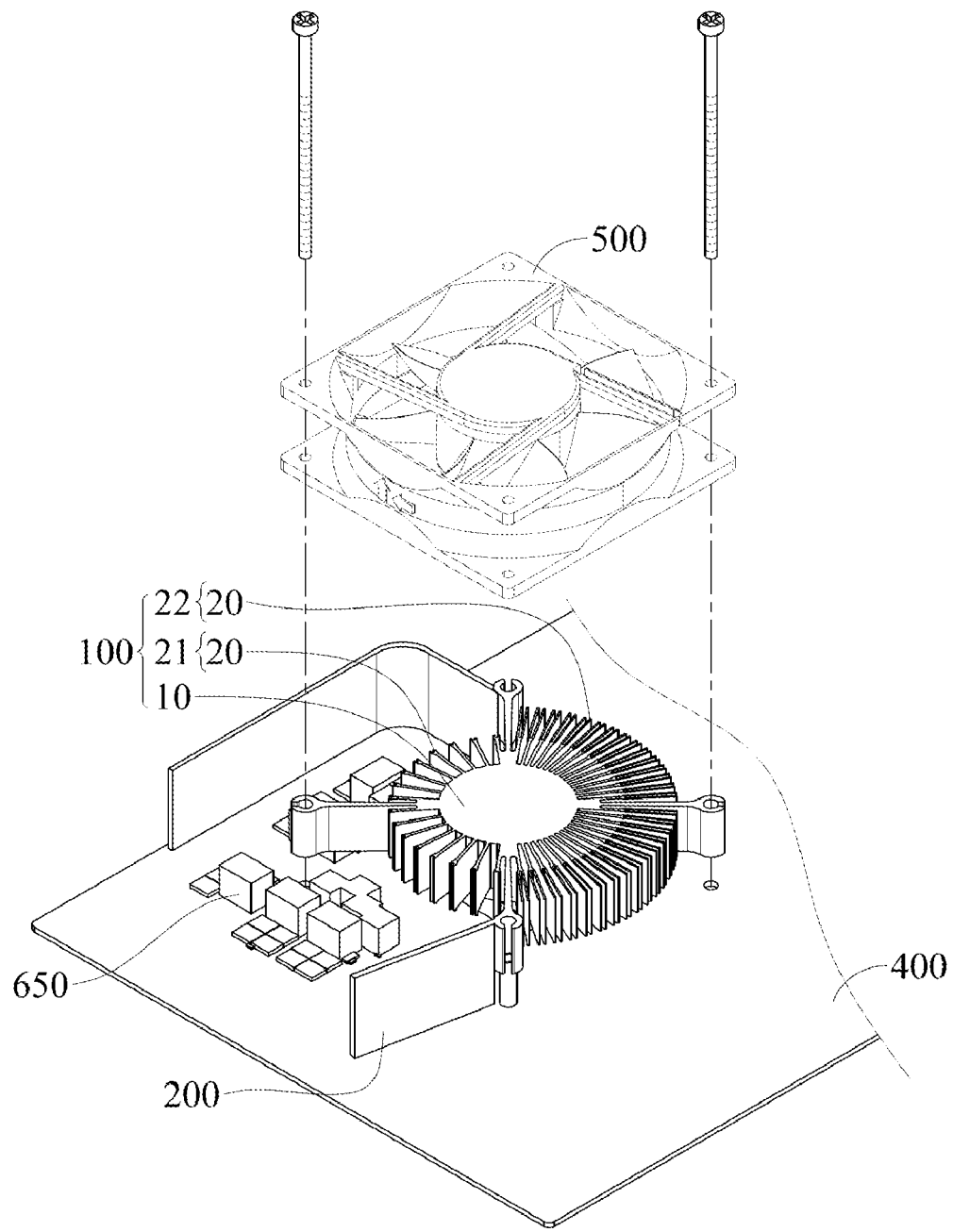
FIG. 3 is an exploded three-dimensional view of the circuit board module in FIG. 2.

In some embodiments, the flow guide baffles 200 and the annular radiator 100 are independent elements respectively, and the connected ends 201 of the flow guide baffles 200 are connected to the annular radiator 100 by welding, sticking, snapping, locking, or riveting, as shown in FIG. 1. In other embodiments, the flow guide baffles 200 and the annular radiator 100 are integrally formed as single elements, as shown in FIG. 3. In other words, the flow guide baffles 200 are plates protruding outward from the annular radiator 100 and extending by a predetermined distance when viewed from a top view. For example, the flow guide baffles 200 and the annular radiator 100 are heat dissipation elements formed by an aluminum extrusion die.

In some embodiments, the flow guide baffles 200 and the annular radiator 100 are made of metal with high heat conductivity. For example, the material of the flow guide baffles 200 and the annular radiator 100 may be, but is not limited to, aluminum.

In some embodiments, the flow guide baffles 200 may be, but are not limited to, a cuboid, a plate having one or more bends, or a plate having a curved radian.

In some embodiments, the annular radiator 100 includes a heat conduction body 10, a plurality of heat dissipation fins 20, and a plurality of heat conduction branches 300. The plurality of heat dissipation fins 20 and the plurality of heat conduction branches 300 are arranged radially and connected to a peripheral surface of the heat conduction body 10. Each heat conduction branch 300 is located between any two adjacent heat dissipation fins 20, and has a first end 301 and a second end 302 opposite to each other (viewed from a top view). The first end 301 of each heat conduction branch 300 is connected to the peripheral surface of the heat conduction body 10, and the connected ends 201 of the two flow guide baffles 200 are connected to the second ends 302 of two heat conduction branches 300 among the plurality of heat conduction branches 300 respectively.

In some embodiments, the two heat conduction branches 300 connected to the two flow guide baffles 200 may be connected to non-opposite sides of the heat conduction body 10 respectively.

In other embodiments, the two heat conduction branches 300 connected to the two flow guide baffles 200 may also be connected to opposite sides of the annular radiator 100 respectively. Specifically, the first ends 301 of the two heat conduction branches 300 connected to the two flow guide baffles 200 are connected to opposite sides of the heat conduction body 10 respectively, as shown in FIG. 1. In other words, a connecting line of the first ends 301 of the two heat conduction branches 300 passes through an axis of the heat conduction body 10.

In some embodiments, there may be an even number of heat conduction branches 300, which are connected to the opposite sides of the heat conduction body 10 oppositely in pairs. For example, it is assumed that the annular radiator 100 has four heat conduction branches 300. The four heat conduction branches 300 may be connected to the heat conduction body 10 in a cross-shaped configuration.

In some embodiments, the second ends 302 of the plurality of heat conduction branches 300 may also be configured to provide a fixing element to fix the heat conduction branches 300 with other elements. For example, the fixing element may be a screw, a snap post, a snap hook, or a rivet.

In some embodiments, the heat dissipation fins 20, the heat conduction branches 300, and the heat conduction body 10 are independent elements respectively, and the heat dissipation fins 20 and the heat conduction branches 300 are connected to the heat conduction body 10 by welding, sticking, snapping, locking, or riveting (not shown in the figure). In other embodiments, the heat dissipation fins 20, the heat conduction branches 300, and the heat conduction body 10 are integrally formed as single elements, as shown in FIG. 1. In other words, the heat dissipation fins 20 and the heat conduction branches 300 are sheet structures protruding outward from the heat conduction body 10 and extending by a predetermined distance when viewed from a top view. For example, the heat dissipation fins 20, the heat conduction branches 300, and the heat conduction body 10 are heat dissipation elements formed by an aluminum extrusion die. In still other embodiments, the heat conduction branches 300 and the heat conduction body 10 are integrally formed as single elements. The heat dissipation fins 20 are independent elements independent of the heat conduction body 10, but are connected to the heat conduction body 10 by welding, sticking, snapping, locking, or riveting (not shown in the figure). In still other embodiments, the heat dissipation fins 20 and the heat conduction body 10 are integrally formed as single elements. The heat conduction branches 300 are independent elements independent of the heat conduction body 10, but are connected to the heat conduction body 10 by welding, sticking, snapping, locking, or riveting (not shown in the figure).

Figure 4:
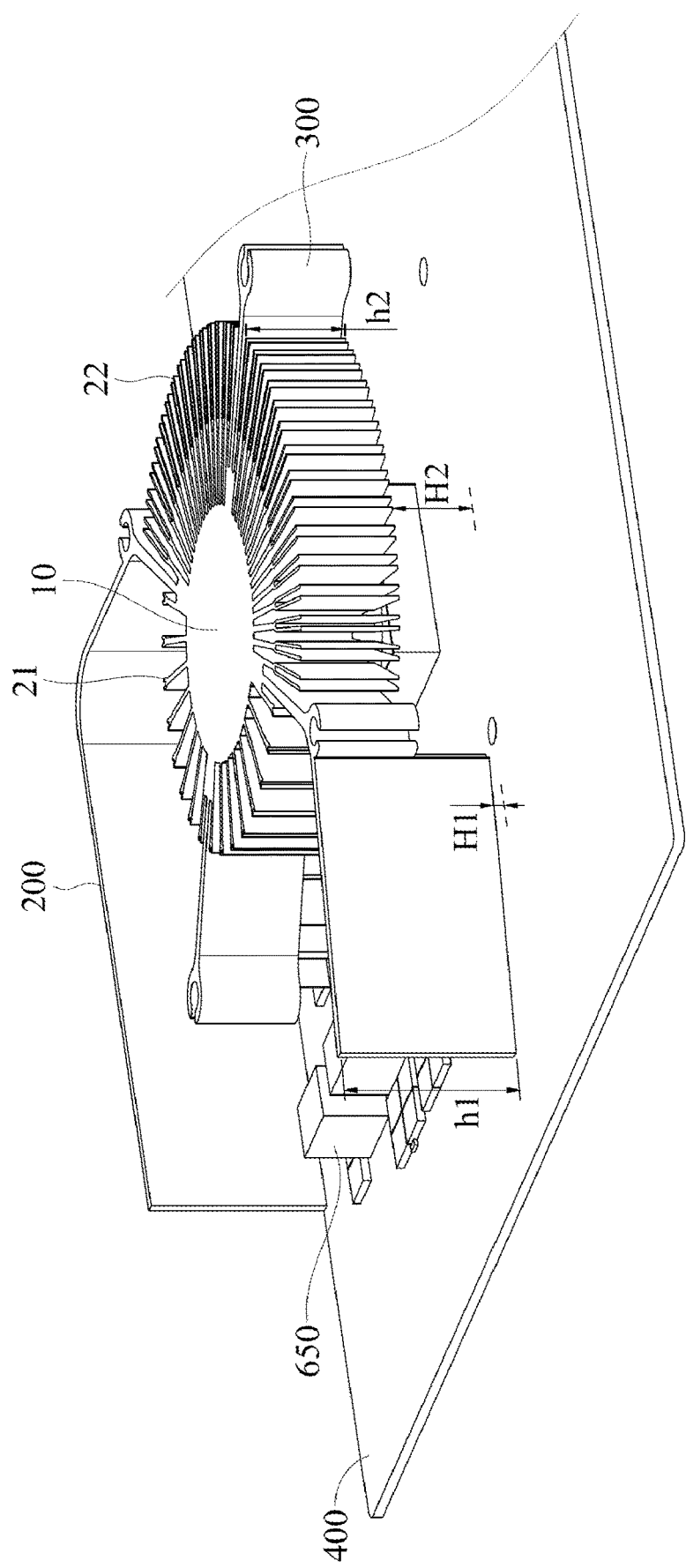
FIG. 4 is a schematic three-dimensional view of the heat dissipation system in FIG. 2.

In some embodiments, the flow guide baffles 200 and the heat conduction branches 300 are independent elements respectively, and the flow guide baffles 200 are connected to the second ends 302 of the heat conduction branches 300 by welding, sticking, snapping, locking, or riveting, as shown in FIG. 1. In other embodiments, the flow guide baffles 200 and the heat conduction branches 300 may also be integrally formed as single elements, as shown in FIG. 3 and FIG. 4. In other words, the flow guide baffles 200 are plates protruding outward from the second ends 302 of the heat conduction branches 300 and extending by a predetermined distance when viewed from a top view. For example, the flow guide baffles 200 and the heat conduction branches 300 are heat dissipation elements formed by an aluminum extrusion die.

Reference is made to FIG. 4. To clearly present the design of the heat dissipation system 1, FIG. 4 omits drawing of a fan 500. In some embodiments, a fin height h2 of the heat dissipation fins 20 is smaller than a baffle height h1 of the flow guide baffles 200 when viewed from a side view. In other words, an absolute distance between an upper edge and a lower edge of each heat dissipation fin 20 is smaller than an absolute distance between an upper edge and a lower edge of each flow guide baffle 200.

In some embodiments, referring back to FIG. 1, each flow guide baffle 200 has baffle lengths L0, L0' extending from the connected end 201 to the free end 202. Each heat dissipation fin 20 has fin lengths L1, L2, that is, an absolute distance between a side surface of the heat conduction body 10 and the end of the heat dissipation fin 20. Herein, the baffle lengths L0, L0' of the flow guide baffle 200 are greater than or equal to the fin lengths L1, L2 of the heat dissipation fin 20.

In some embodiments, a branch length of each heat conduction branch 300 may be greater than the fin lengths L1, L2 of the heat dissipation fin 20. That is, the heat conduction branch 300 may protrude from the end of the heat dissipation fin 20 when viewed from a top view. Herein, the branch length refers to an absolute distance between the side surface of the heat conduction body 10 and the second end 302 (terminal) of the heat conduction branch 300. In some embodiments, the second end 302 of each heat conduction branch 300 is completely protruding from the end of the heat dissipation fin 20. Specifically, the second end 302 of each heat conduction branch 300 is located on the other side of a connecting line of the ends of the two heat dissipation fins 20 adjacent to the heat conduction branch 300 relative to the heat conduction body 10.

Referring again to FIG. 1, in some embodiments, the plurality of heat dissipation fins 20 is divided into a first fin group 21 and a second fin group 22 by a connecting line of the connected ends 201 of the two flow guide baffles 200. The first fin group 21 is adjacent to the heat source area 600, and a total heat dissipation area of the first fin group 21 is smaller than a total heat dissipation area of the second fin group 22.

In some embodiments, when the two flow guide baffles 200 to which the two flow guide baffles 200 are connected are connected to the opposite sides of the heat conduction body 10 respectively, the plurality of heat dissipation fins 20 is divided into two groups: the first fin group 21 and the second fin group 22 by an extension line LL (straight line) perpendicular to and passing through the axis of the heat conduction body 10. Specifically, the annular radiator 100 is divided in half into two blocks by the extension line LL passing through the connected ends 201 of the two flow guide baffles 200 and the axis of the heat conduction body 10, as shown in FIG. 1. Hereinafter, the block on the left of the two blocks is referred to as a left block, while the block on the right is referred to as a right block. The heat dissipation fins 20 located in the left block among the plurality of heat dissipation fins 20 belong to the first fin group 21, and the heat dissipation fins 20 located in the right block among the plurality of heat dissipation fins 20 belong to the second fin group 22. In some embodiments, the extension line LL overlaps the axis connecting the two flow guide baffles 200 and connected to the two heat conduction branches 300 on the opposite sides of the heat conduction body 10. In other words, the plurality of heat dissipation fins 20 are also divided into the first fin group 21 and the second fin group 22 by the axis connecting the two flow guide baffles 200 and connected to the two heat conduction branches 300 on the opposite sides of the heat conduction body 10.

In some embodiments, an interval I1 between any two adjacent heat dissipation fins 20 in the first fin group 21 is greater than an interval I2 between any two adjacent heat dissipation fins 20 in the second fin group 22 in the case of different total heat dissipation areas, as shown in FIG. 1. Herein, the intervals I1, I2 refer to shortest distances between junctions of any two adjacent heat dissipation fins 20 and the heat conduction body 10.

In some embodiments, a fin number of the first fin group 21 (namely, a total number of heat dissipation fins 20 in the first fin group 21) may be smaller than a fin number of the second fin group 22 (namely, a total number of heat dissipation fins 20 in the second fin group 22) in the case of different total heat dissipation areas. For example, the fin number of the second fin group 22 is 30 (PCS), while the fin number of the first fin group 21 is 10-22. In some examples, the fin number of the second fin group 22 is 30, while the fin number of the first fin group 21 is 10, 16, or 22.

In some embodiments, in the case of different intervals I1, I2 between the foregoing heat dissipation fins 20 and/or different fin numbers, the fin length L1 of the first fin group 21 may be smaller than the fin length L2 of the second fin group 22, as shown in FIG. 1. For example, the fin length L2 of the second fin group 22 is 27 mm, while the fin length L1 of the first fin group 21 is 13.5 mm.

Figure 8:
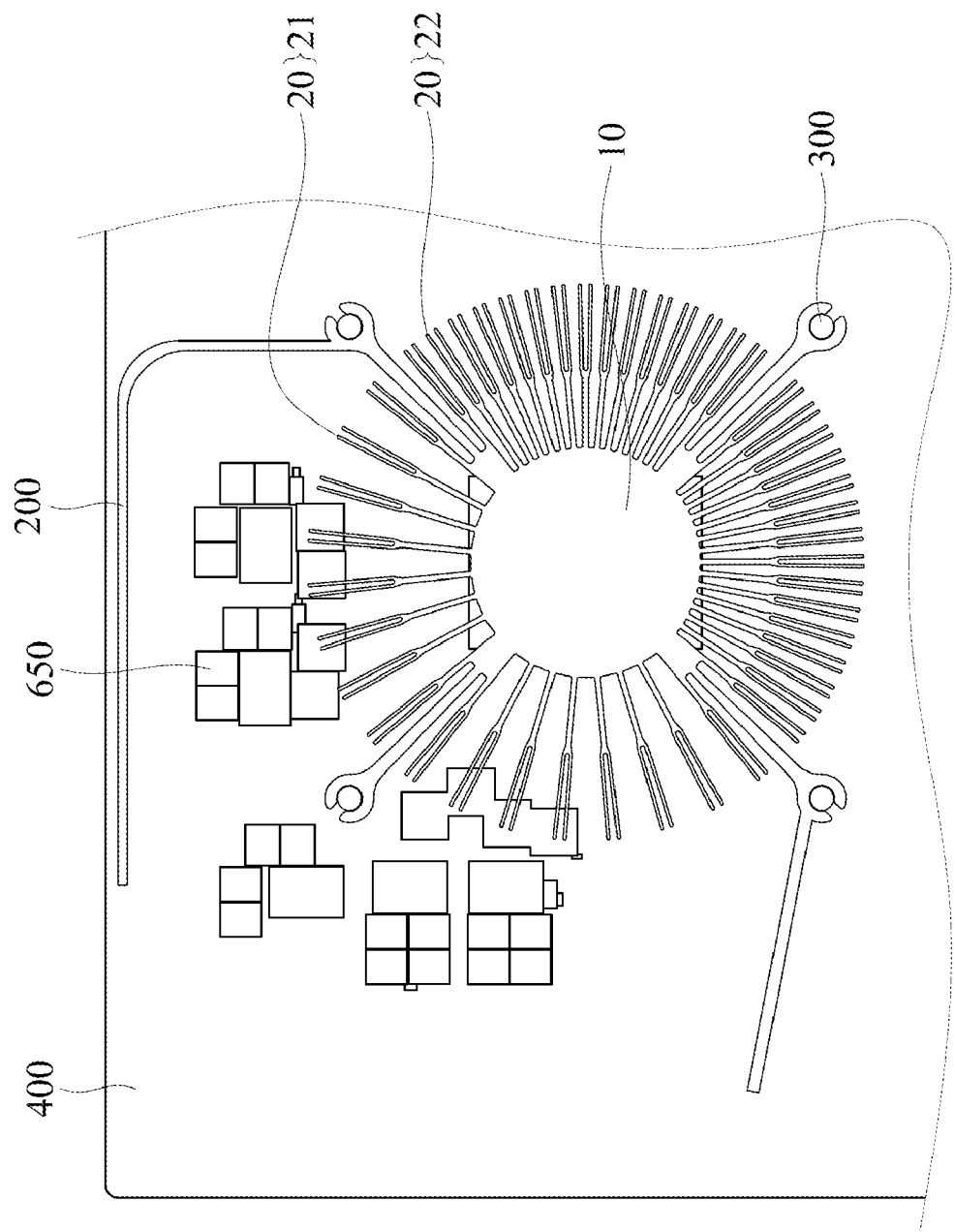
FIG. 8 is a schematic partial view of a circuit board module according to a fourth example in a top view.

In other embodiments, in the case of different intervals I1, I2 between the foregoing heat dissipation fins 20 and/or different fin numbers, the fin length L1 of the first fin group 21 may be equal to the fin length L2 of the second fin group 22, as shown in FIG. 8. For example, the fin lengths L1, L2 of the first fin group 21 and the second fin group 22 are 27 mm.

In still other embodiments, in the case of different intervals I1, I2 between the foregoing heat dissipation fins 20 and/or different fin numbers, the fin length L1 of the first fin group 21 may be greater than the fin length L2 of the second fin group 22. For example, the fin length L2 of the second fin group 22 is 27 mm, while the fin length L1 of the first fin group 21 is 40.5 mm.

Figure 11:
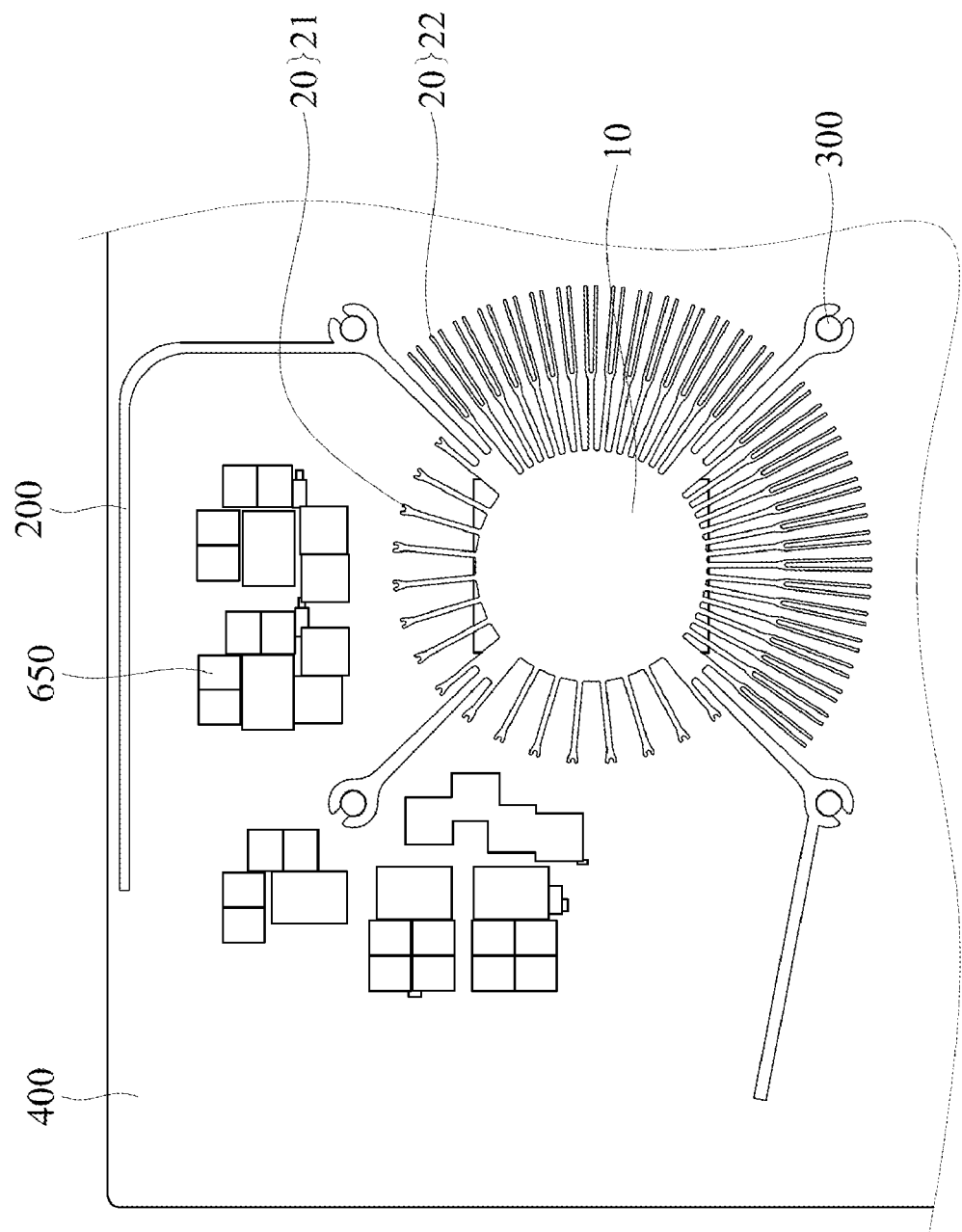
FIG. 11 is a schematic partial view of a circuit board module according to a seventh example in a top view.

For example, in a first embodiment, the interval I1 between any two adjacent heat dissipation fins 20 in the first fin group 21 is greater than the interval I2 between any two adjacent heat dissipation fins 20 in the second fin group 22. The fin number of the first fin group 21 is smaller than the fin number of the second fin group 22, while the fin length L1 of the first fin group 21 is smaller than the fin length L2 of the second fin group 22, as shown in FIG. 1 and FIG. 11.

In a second embodiment, only the fin length L1 of the first fin group 21 is smaller than the fin length L2 of the second fin group 22, the interval I1 between any two adjacent heat dissipation fins 20 in the first fin group 21 is equal to the interval I2 between any two adjacent heat dissipation fins 20 in the second fin group 22, and the fin number of the first fin group 21 is equal to the fin number of the second fin group 22 (not shown in the figure).

Figure 9:
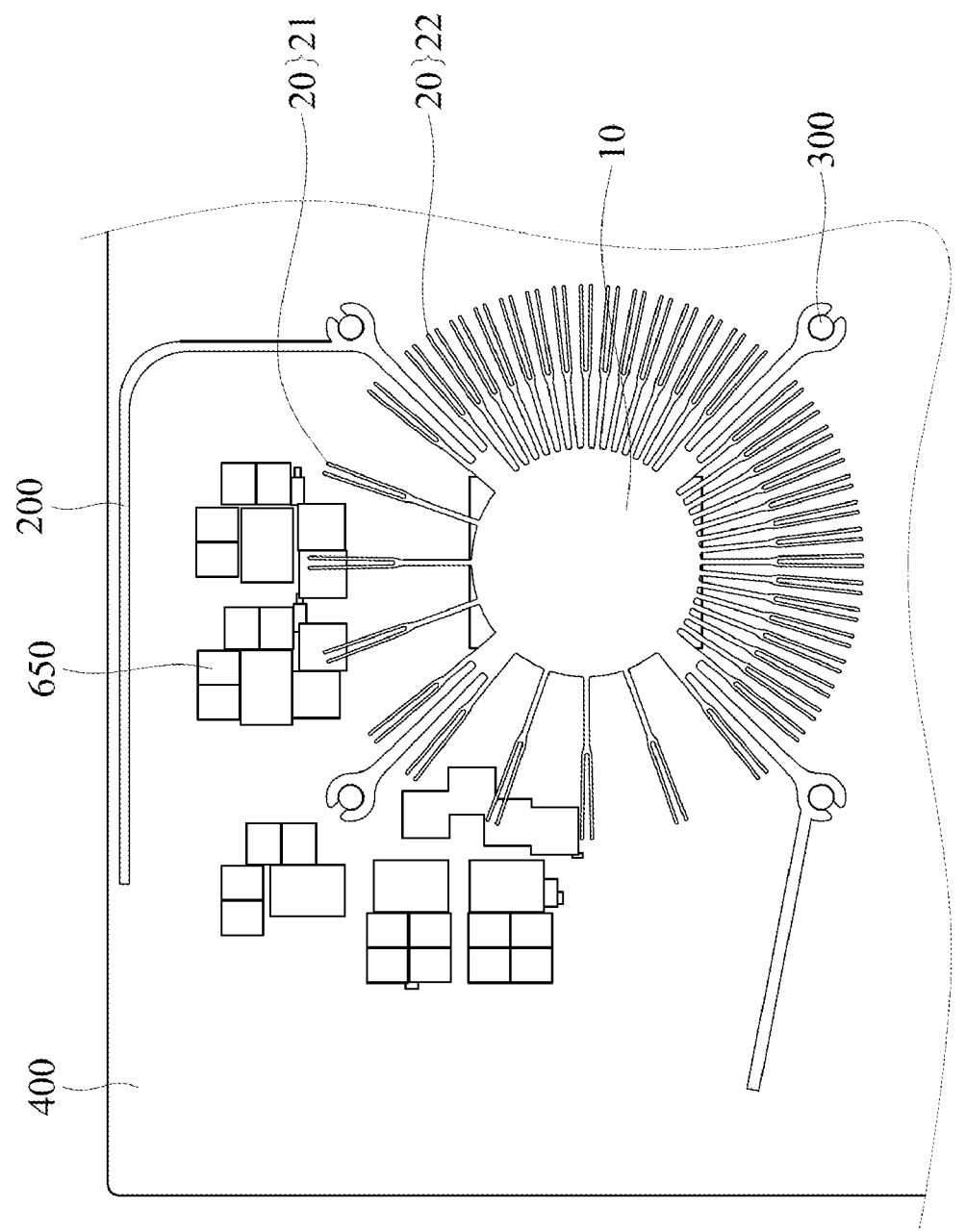
FIG. 9 is a schematic partial view of a circuit board module according to a fifth example in a top view.
Figure 10:
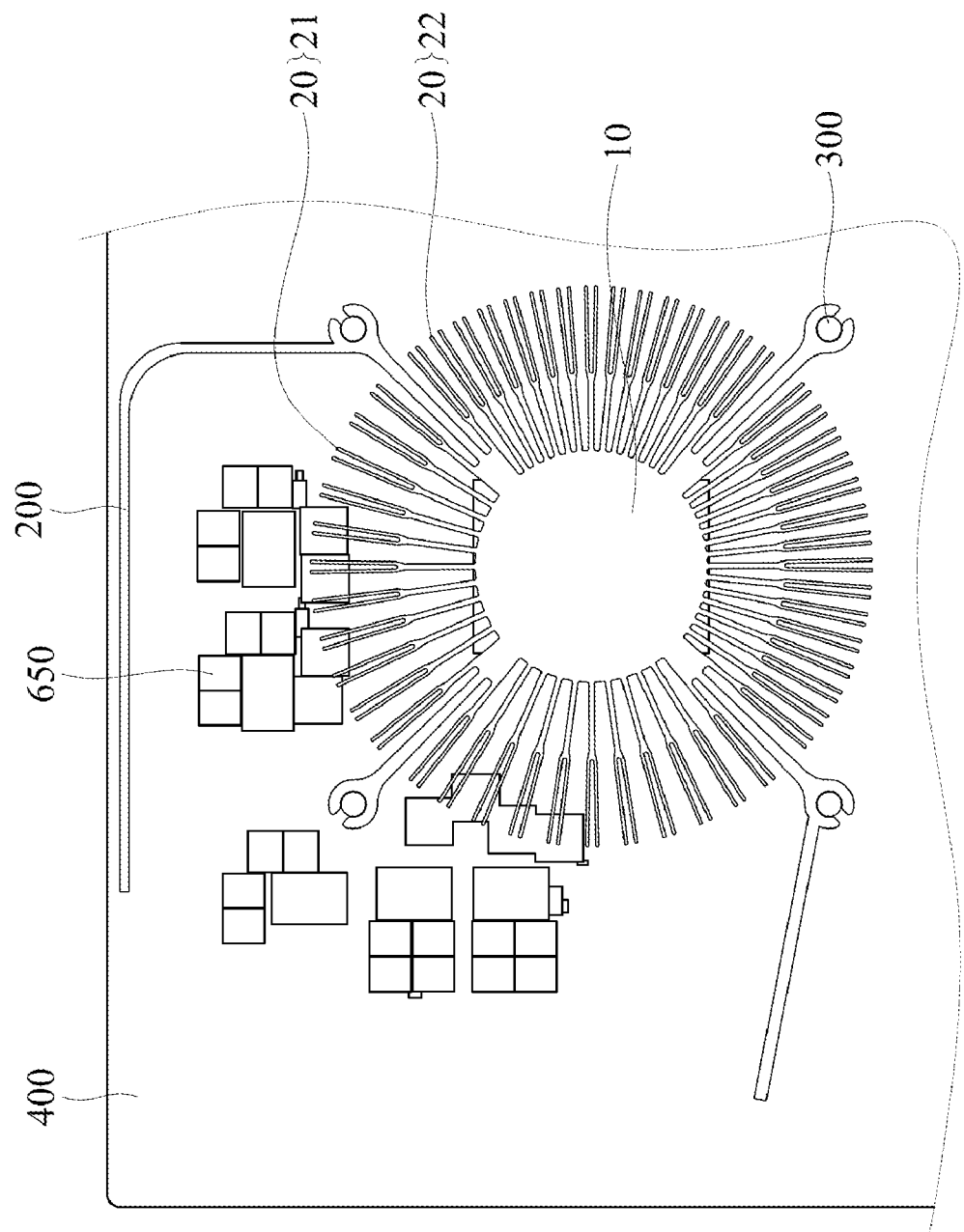
FIG. 10 is a schematic partial view of a circuit board module according to a sixth example in a top view.

In a third embodiment, the interval I1 between any two adjacent heat dissipation fins 20 in the first fin group 21 is greater than the interval I2 between any two adjacent heat dissipation fins 20 in the second fin group 22, and the fin number of the first fin group 21 is smaller than the fin number of the second fin group 22. However, the fin length L1 of the first fin group 21 is equal to the fin length L2 of the second fin group 22, as shown in FIG. 8 to FIG. 10.

Figure 12:
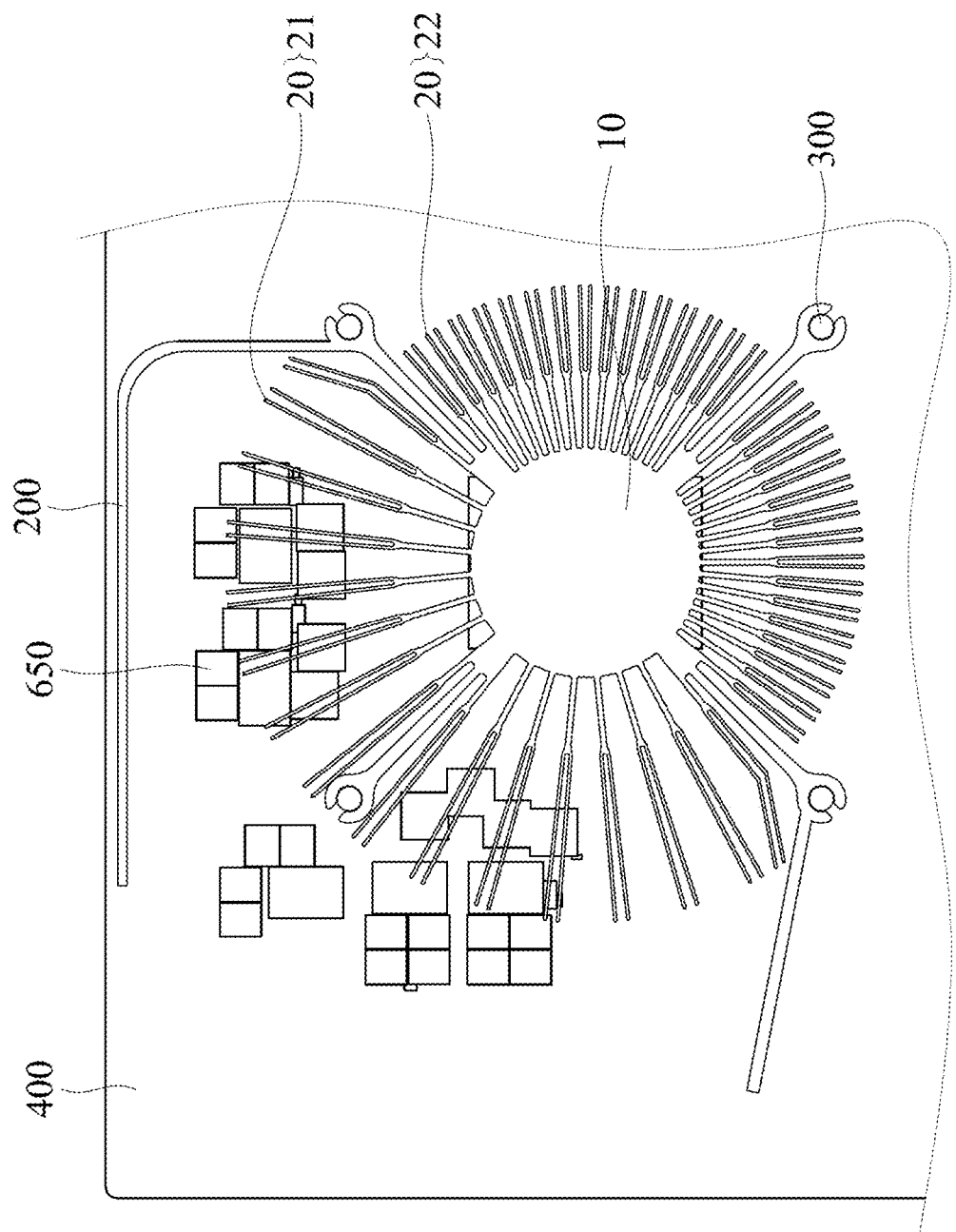
FIG. 12 is a schematic partial view of a circuit board module according to an eighth example in a top view.

In a fourth embodiment, the interval I1 between any two adjacent heat dissipation fins 20 in the first fin group 21 is greater than the interval I2 between any two adjacent heat dissipation fins 20 in the second fin group 22. The fin number of the first fin group 21 is smaller than the fin number of the second fin group 22, while the fin length L1 of the first fin group 21 is greater than the fin length L2 of the second fin group 22, as shown in FIG. 12.

In a fifth embodiment, only the fin length L1 of the first fin group 21 is greater than the fin length L2 of the second fin group 22, the interval I1 between any two adjacent heat dissipation fins 20 in the first fin group 21 is equal to the interval I2 between any two adjacent heat dissipation fins 20 in the second fin group 22, and the fin number of the first fin group 21 is equal to the fin number of the second fin group 22 (not shown in the figure).

In some embodiments, the total heat dissipation area of the first fin group 21 is smaller than or equal to 80% of the total heat dissipation area of the second fin group 22.

In an example, the total heat dissipation area may refer to the sum of surface areas of all the heat dissipation fins 20 in a fin group. Specifically, the sum of the surface areas of all the heat dissipation fins 20 in the first fin group 21 is smaller than or equal to 80% of the sum of the surface areas of all the heat dissipation fins 20 in the second fin group 22.

In another example, the total heat dissipation area may refer to the sum of distributed areas occupied by all the heat dissipation fins 20 of a fin group as viewed from a top view. Specifically, the sum of the distributed areas occupied by all the heat dissipation fins 20 in the first fin group 21 in the heat source area 600 (namely, the area distributed in the heat source area 600) is smaller than or equal to 80% of the sum of the distributed areas occupied by all the heat dissipation fins 20 in the second fin group 22 in a non-heat source area (namely, the area distributed in the non-heat source area).

Figure 2:
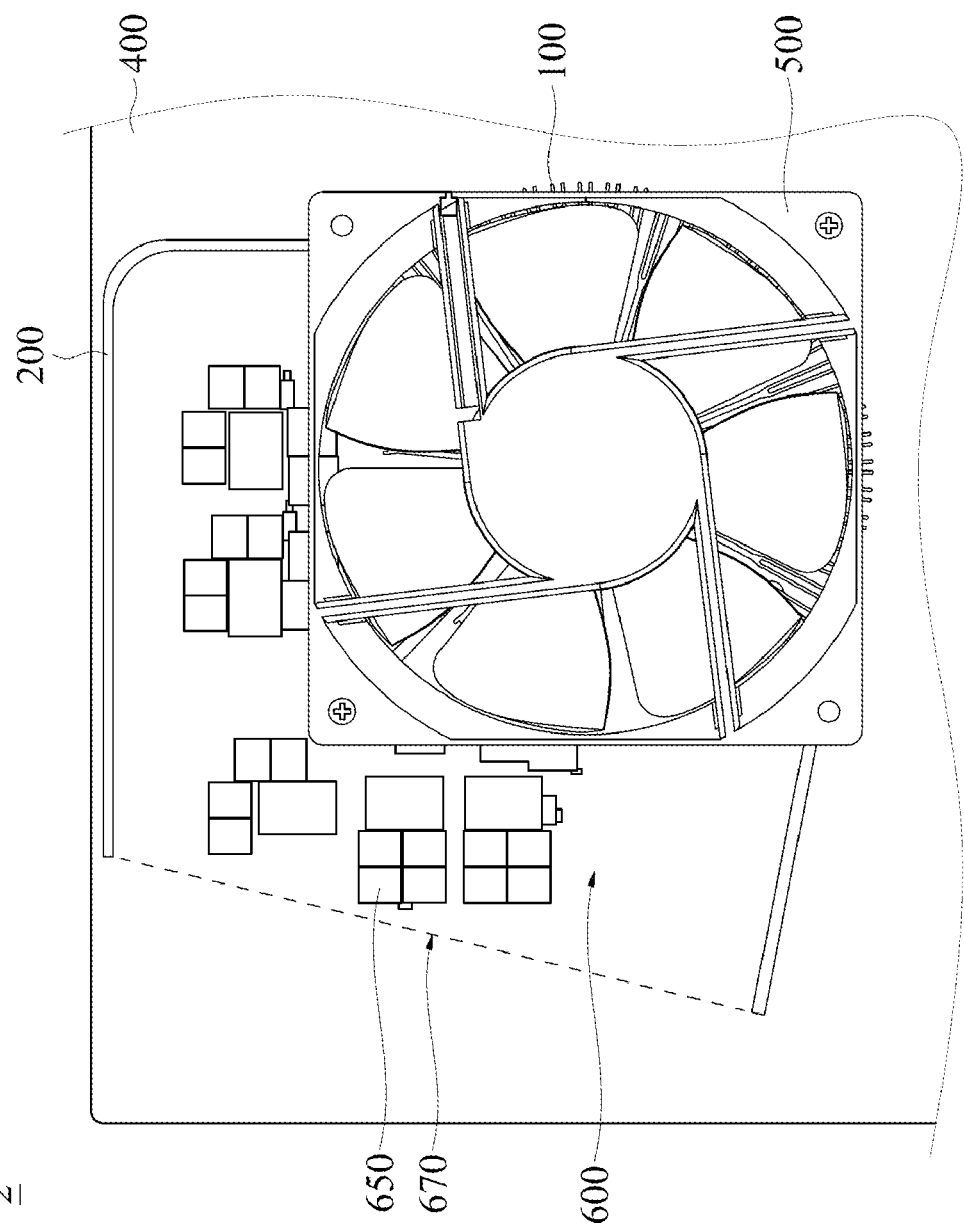
FIG. 2 is a schematic partial view of a circuit board module according to an embodiment.

Reference is made to FIG. 2 to FIG. 4. The heat dissipation system 1 of any of the foregoing embodiments may be applied to a circuit board module 2. In other words, the circuit board module 2 includes a circuit board 400, the heat dissipation system 1 having the annular radiator 100 and the two flow guide baffles 200 of any of the foregoing embodiments, a fan 500, and a plurality of heating elements 650. In addition, the annular radiator 100 of the heat dissipation system 1 is sandwiched between the fan 500 and the circuit board 400, and the circuit board 400 in the heat source area 600 is provided with the plurality of heating elements 650. Herein, the structural designs of the annular radiator 100 and the two flow guide baffles 200 of the heat dissipation system 1 are as described above, and will not be described in detail.

Figure 7:
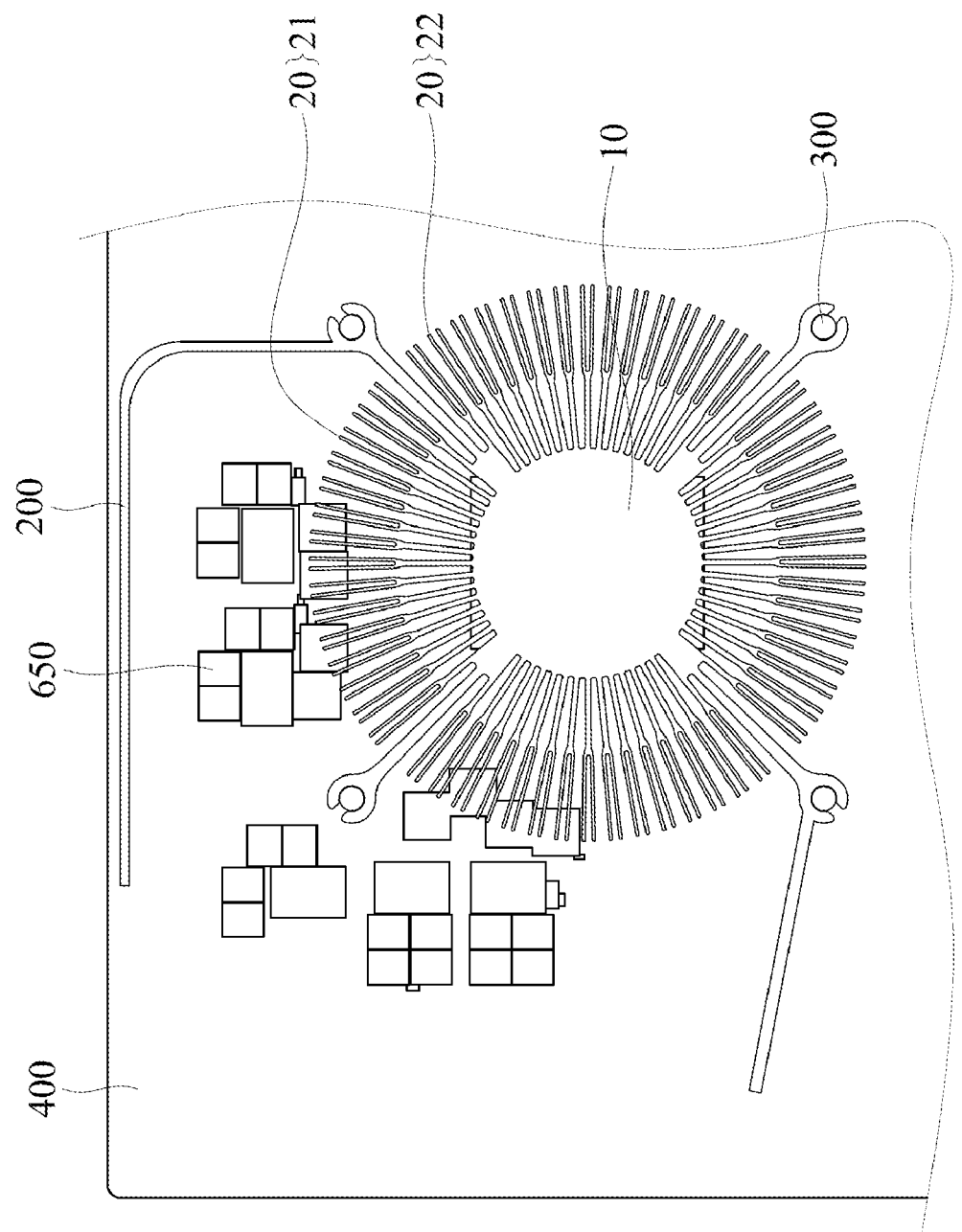
FIG. 7 is a schematic partial view of a circuit board module according to a third example in a top view.

The annular radiator 100 is disposed on the circuit board 400. In some embodiments, the heat conduction body 10 of the annular radiator 100 is disposed on the circuit board 400, and a lower surface of the heat conduction body 10 is attached to the surface of the circuit board 400. In some embodiments, the circuit board 400 may be fastened together with the second ends 302 of at least two heat conduction branches 300 of the annular radiator 100 by a fastening element, whereby the annular radiator 100 is securely fixed to the circuit board 400. For example, the fastening element may be a screw, a snap post, a snap hook, or a rivet. Specifically, in an example, the second ends 302 of the at least two heat conduction branches 300 have limiting holes, and the circuit board 400 has fixing holes at positions corresponding to the second ends 302 of the heat conduction branches 300. Each screw is locked into the fixing hole in the circuit board 400 through the limiting hole in the second end 302 of the heat conduction branch 300, thereby fixing the annular radiator 100 on the circuit board 400. In another example, the second ends 302 of the at least two heat conduction branches 300 have snap hooks, and the circuit board 400 has protruding snap posts at positions corresponding to the second ends 302 of the heat conduction branches 300. The snap hooks of the heat conduction branches 300 snap the corresponding snap posts on the circuit board 400, thereby fixing the annular radiator 100 on the circuit board 400, as shown in FIG. 7.

The fan 500 is electrically connected to the circuit board 400, and disposed on the annular radiator 100. In some embodiments, the fan 500 is assembled on the annular radiator 100. In some embodiments, the fan 500 may be fastened together with the second ends 302 of at least two heat conduction branches 300 of the annular radiator 100 by a fastening element, whereby the fan 500 is securely fixed to the annular radiator 100. For example, the fastening element may be a screw, a snap post, a snap hook, or a rivet. Specifically, in an example, the second ends 302 of the at least two heat conduction branches 300 have fixing holes, and the fan 500 has limiting holes at positions corresponding to the second ends 302 of the heat conduction branches 300. Each screw is locked into the fixing hole in the second end 302 of the heat conduction branch 300 through the limiting hole in the fan 500, thereby fixing the fan 500 on the annular radiator 100 (not shown in the figure). In some embodiments, the fan 500 and the second ends 302 of the at least two heat conduction branches 300 of the annular radiator 100 may be simultaneously fastened on the circuit board 400 by the fastening element. For example, the fastening element is a screw. The second ends 302 of the at least two heat conduction branches 300 have limiting holes, the fan 500 also has limiting holes at positions corresponding to the second ends 302 of the heat conduction branches 300, and the circuit board 400 has fixing holes at positions corresponding to the second ends 302 of the heat conduction branches 300. Each screw is locked into the fixing hole in the circuit board 400 through the limiting hole in the fan 500 and the limiting hole in the second end 302 of the heat conduction branch 300 sequentially, thereby fixing the fan 500 and the annular radiator 100 on the circuit board 400, as shown in FIG. 3.

Referring again to FIG. 1 to FIG. 3, the heating element 650 is located in the heat source area 600 surrounded by the flow guide baffles 200 and the annular radiator 100 and assembled on the circuit board 400. In other words, the flow guide baffles 200 and the annular radiator 100 surround three sides of the heating element 650. Therefore, since the flow guide baffles 200 can guide airflow generated by the fan 500 to the lateral opening 670, the flow field can be accurately guided to the heating element 650 located in the heat source area 600 to dissipate heat, whereby the heating element 650 obtains a better cooling effect.

In some embodiments, each flow guide baffle 200 is a plate standing above the circuit board 400.

Reference is made to FIG. 4. In some embodiments, there is a distance H1 between a lower edge of the flow guide baffle 200 and an upper surface of the circuit board 400. Herein, the distance H1 is greater than or equal to 0 mm and less than or equal to 0.5 mm. That is, the distance H1 between the flow guide baffle 200 and the circuit board 400 is greater than or equal to 0 mm and less than or equal to 0.5 mm. Therefore, the flow guide baffle 200 may or may not be in contact with the circuit board 400. In some examples, when the distance H1 between the flow guide baffle 200 and the circuit board 400 is equal to 0 mm, the flow guide baffle 200 will be in contact with the circuit board 400. Conversely, in other examples, when the distance H1 between the flow guide baffle 200 and the circuit board 400 is greater than 0 mm but not greater than 0.5 mm, the flow guide baffle 200 is not in contact with the surface of the circuit board 400.

In some embodiments, there is a distance H2 between a lower edge of the heat dissipation fin 20 and the upper surface of the circuit board 400, and the distance H2 is greater than the distance H1.

Herein, the connecting line of the connected ends 201 of the two flow guide baffles 200 divides the heat dissipation fins 20 of the annular radiator 100 into two groups: the first fin group 21 and the second fin group 22. The plurality of heat dissipation fins 20 near the heat source area 600 are in the first fin group 21, and the plurality of heat dissipation fins 20 far away from the heat source area 600 are in the second fin group 22.

In some embodiments, the annular radiator 100 is divided in a non-half manner into two blocks: a left block on the left and a right block on the right. In other embodiments, the annular radiator 100 may also be divided in half into two blocks: a left block on the left and a right block on the right.

The left block is adjacent to the heat source area 600. Herein, the first fin group 21 includes all the heat dissipation fins 20 located in the left block, and the second fin group 22 includes all the heat dissipation fins 20 located in the right block. In other words, the first fin group 21 is adjacent to the heating element 650 relative to the second fin group 22.

In addition, as described above, the first fin group 21 and the second fin group 22 may have the same total heat dissipation area, intervals I1, I2 between the heat dissipation fins 20, fin numbers, fin lengths L1, L2, or any combination thereof, and may differ in at least one of various structural parameters such as the heat dissipation area, the intervals I1, I2 between the heat dissipation fins 20, the fin numbers, and the fin lengths L1, L2.

Figure 6:
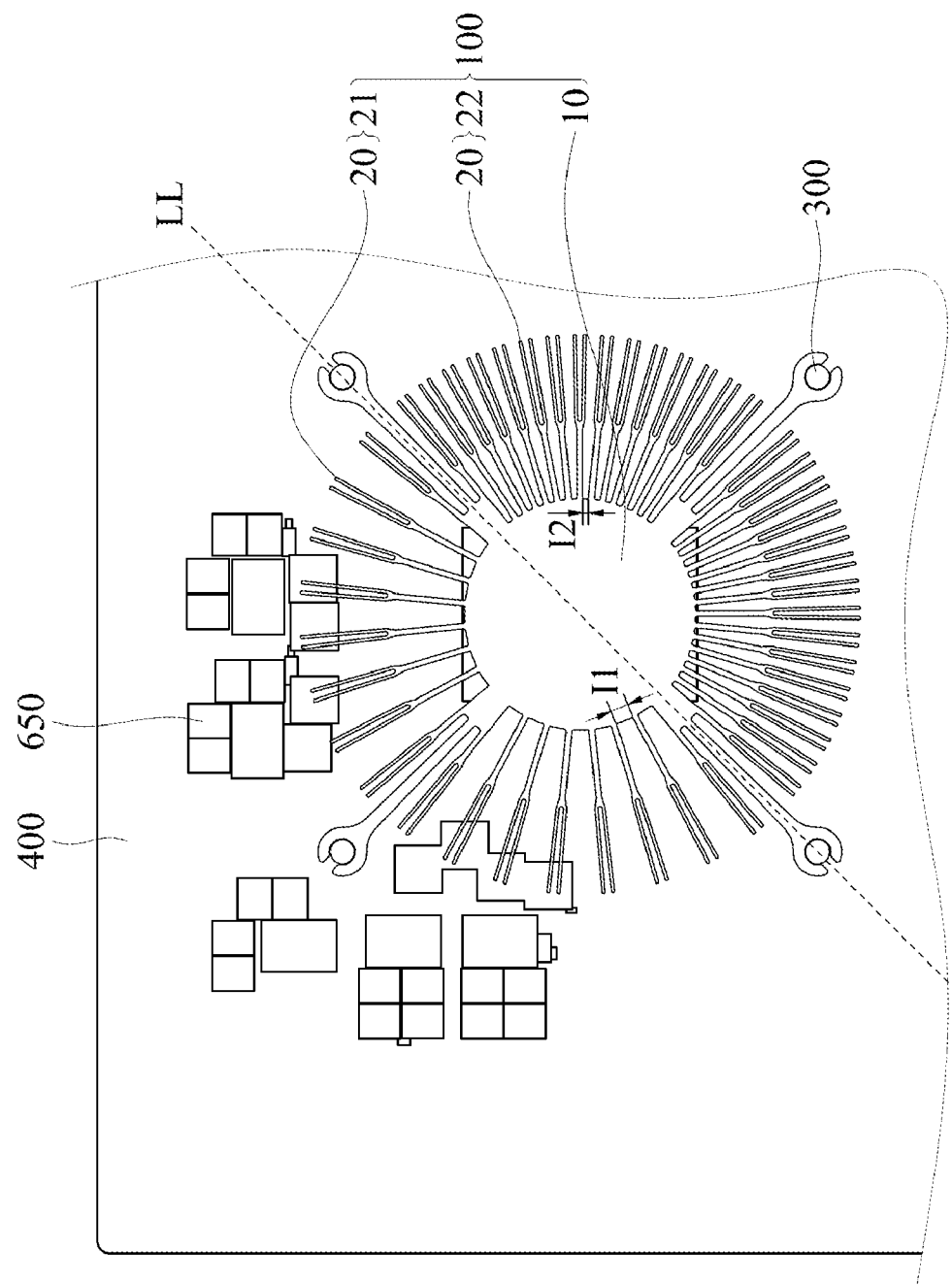
FIG. 6 is a schematic partial view of a circuit board module according to a second example in a top view.

Reference is made to FIG. 6. In some embodiments, the heat dissipation system 1 may not have the flow guide baffles 200, but the heat dissipation fins 20 of the annular radiator 100 have different densities, resulting in a larger flow rate to improve the heat dissipation effect. Herein, the components of the annular radiator 100 and the connection relationships thereof are substantially the same as described above. It is to be understood that the annular radiator 100 may be of a structural design with the heat conduction branches 300 or without the heat conduction branches 300.

In such embodiments, all of the heat dissipation fins 20 of the annular radiator 100 are divided into two groups: the first fin group 21 and the second fin group 22, and the interval I1 between any two adjacent heat dissipation fins 20 in the first fin group 21 is greater than the interval I2 between any two adjacent heat dissipation fins 20 in the second fin group 22.

In some embodiments, the annular radiator 100 may be divided in a non-half manner into two blocks: a left block on the left and a right block on the right. In other embodiments, the annular radiator 100 may also be divided in half into two blocks: a left block on the left and a right block on the right. In other words, the plurality of heat dissipation fins 20 is divided into the first fin group 21 and the second fin group 22 by the extension line LL perpendicular to and passing through the axis of the heat conduction body 10.

The first fin group 21 includes all the heat dissipation fins 20 located in the left block, and the second fin group 22 includes all the heat dissipation fins 20 located in the right block.

In some embodiments, the fin number of the first fin group 21 may be smaller than the fin number of the second fin group 22 in the case of different intervals I1, I2 between the heat dissipation fins 20. For example, the fin number of the second fin group 22 is 30 (PCS), while the fin number of the first fin group 21 is 10-22. In some examples, the fin number of the second fin group 22 is 30, while the fin number of the first fin group 21 is 10, 16, or 22.

In some embodiments, in the case of different intervals I1, I2 between the foregoing heat dissipation fins 20 and/or different fin numbers, the fin length L1 of the first fin group 21 may be equal to the fin length L2 of the second fin group 22, as shown in FIG. 6. For example, the fin lengths L1, L2 of the first fin group 21 and the second fin group 22 are 27 mm.

In some embodiments, the annular radiator 100 of any of the foregoing embodiments, which is not connected to the flow guide baffles 200 but has the heat dissipation fins 20 of different densities, may also be applied to the circuit board module 2. Specifically, referring to FIG. 6, the circuit board module 2 includes a circuit board 400, a plurality of heating elements 650, a heat dissipation system 1 without flow guide baffles 200 (namely, the foregoing annular radiator 100 having heat dissipation fins 20 of different densities), and a fan 500 (not shown in FIG. 6).

Herein, the plurality of heating elements 650 and the annular radiator 100 are disposed on the circuit board 400, and the plurality of heating elements 650 is located on one side of the annular radiator 100 when viewed from a top view. The fan 500 is electrically connected to the circuit board 400, and located on the annular radiator 100 (referring to the configuration relationship of the fan 500 shown in FIG. 2 and FIG. 3).

Herein, the detailed structural design and configuration relationship of the components in the circuit board module 2 are substantially the same as those of the circuit board module 2 of any of the foregoing embodiments, and the detailed structural design and configuration relationship of the heat conduction body 10 and the heat dissipation fins 20 of the annular radiator 100 are substantially the same as those of the annular radiator 100 of any of the foregoing embodiments, which is not connected to the flow guide baffles 200 but has the heat dissipation fins 20 of different densities. Therefore, the details will not be repeated. It is to be understood that when the annular radiator 100 does not have the heat conduction branches 300, the annular radiator 100 can be fixed to the circuit board 400 by fixing (for example, sticking with a heat conduction adhesive) the heat conduction body 10 to the circuit board 400.

In some embodiments, the foregoing heat conduction body 10 may be, but is not limited to, a cylinder, a cube, or another three-dimensional structure having at least one peripheral surface.

In some embodiments, the foregoing heat dissipation fins 20 may be, but are not limited to, a straight-extending sheet structure, a sheet structure having a curved radian, or a Y-shaped sheet structure from a top view. In some embodiments, when the heat dissipation fins 20 have a Y-shaped sheet structure from a top view, each heat dissipation fin 20 may be divided into a branched section and an unbranched section, and two ends of the unbranched section are connected to a side surface of the heat conduction body 10 and one end of the branched section respectively. In some embodiments, a fin length of the branched section and a fin length of the unbranched section of each heat dissipation fin 20 may be substantially equal.

In some embodiments, each heat conduction branch 300 may include a main branch and at least one sub-branch from a top view. The width of the main branch is greater than that of the sub-branch (unbranched section) from a top view. The first end 301 of each heat conduction branch 300 is formed by merging (fusing) one end of the main branch and one end of each sub-branch. The other end of the main branch is the second end 302 of the heat conduction branch 300. The other end of each sub-branch has the same shape as the end of each heat dissipation fin 20 from a top view. In some embodiments, the other end of each sub-branch is flush with the end of each heat dissipation fin 20. Specifically, an absolute distance from the side surface of the heat conduction body 10 to the other end of each sub-branch is substantially the same as an absolute distance from the side surface of the heat conduction body 10 to the end of each heat dissipation fin 20.

In some embodiments, the foregoing circuit board 400 may be, but is not limited to, a printed circuit board (PCB), a flexible PCB, or a rigid flexible printed circuit board (RFPC).

In some embodiments, in the application of the circuit board module 2, each heat dissipation fin 20 is a sheet structure standing above the circuit board 400.

In some embodiments, each heating element 650 may be an electronic element such as a CPU, a memory, a metal oxide semiconductor (MOS), a choke, a resistor, a capacitor, or a cap.

Reference is made to FIG. 5 to FIG. 12. FIG. 5 to FIG. 12 are schematic partial views of the circuit board module 2 according to a first example to an eighth example respectively. To clearly present the design of the heat dissipation system 1, FIG. 5 to FIG. 12 omit drawing of the fan 500. Hereinafter, a simulation experiment of a flow field is performed with the circuit board module 2 according to the first example to the eighth example, so as to detect the temperature of the heating elements 650. Herein, the heating elements 650 may be a CPU, a MOS, a choke, and a cap respectively. In the first example to the eighth example, the settings of the heating elements 650 and the fan 500 are the same.

Figure 5:
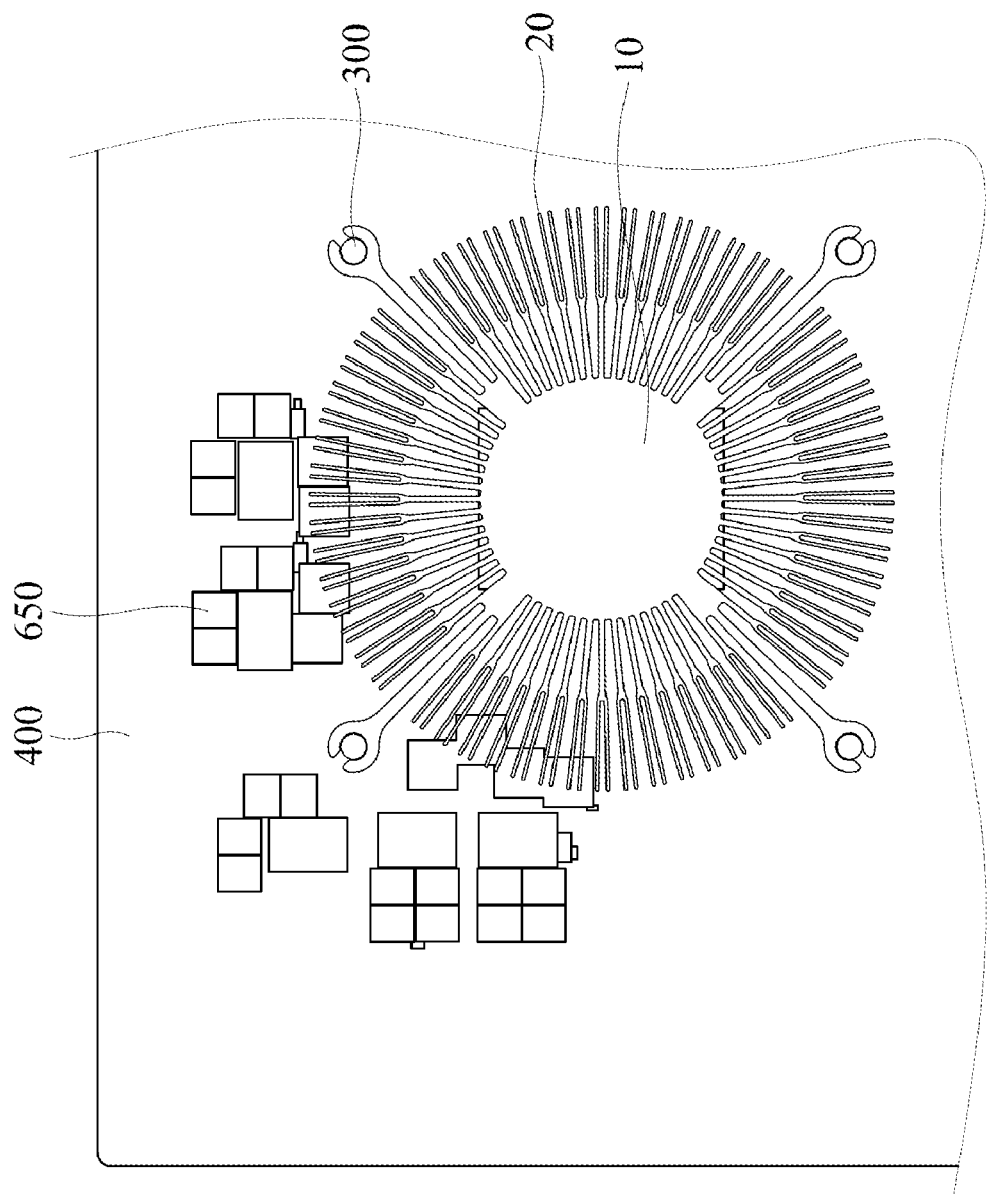
FIG. 5 is a schematic partial view of a circuit board module according to a first example in a top view.

In the first example and the second example, the flow guide baffles 200 are not provided, and the two examples differ in the density of the heat dissipation fins 20, as shown in FIG. 5 and FIG. 6. In the third example to the eighth example, the flow guide baffles 200 are provided, and the embodiments differ in the fin number and/or fin length of the first fin group 21, as shown in FIG. 7 to FIG. 12. The specific structural parameters of the first example to the eighth example are shown in Table 1 below.

TABLE 1

| Example | Flow guide baffle 200 | First fin group 21 | | Second fin group 22 | | Total number of heat dissipation fins 20 (piece) | FIGS. |
|---|---|---|---|---|---|---|---|
| | | Fin number (piece) | Fin length (mm) | Fin number (piece) | Fin length (mm) | | |
| 1 | Not provided | 30 | 27 | 30 | 27 | 60 | FIG. 5 |
| 2 | Not provided | 16 | 27 | 30 | 27 | 46 | FIG. 6 |
| 3 | Provided | 30 | 27 | 30 | 27 | 60 | FIG. 7 |
| 4 | Provided | 16 | 27 | 30 | 27 | 46 | FIG. 8 |
| 5 | Provided | 10 | 27 | 30 | 27 | 40 | FIG. 9 |
| 6 | Provided | 22 | 27 | 30 | 27 | 52 | FIG. 10 |
| 7 | Provided | 16 | 13.5 | 30 | 27 | 46 | FIG. 11 |
| 8 | Provided | 16 | 40.5 | 30 | 27 | 46 | FIG. 12 |

The first example is a common heat dissipation system 1, which is not provided with the flow guide baffles 200 and has the same intervals I1, I2 between the plurality of heat dissipation fins 20, as shown in FIG. 5. The second example is to adjust the fin number of the first fin group 21 (namely, the heat dissipation fins 20 adjacent to the heat source area 600) on the basis of the first example, and reduce the number to 16 heat dissipation fins 20, as shown in FIG. 6. The third example is to add two flow guide baffles 200 on the opposite sides of the heat source area 600 on the basis of the first example, as shown in FIG. 7. The fourth example is to adjust the fin number of the first fin group 21 (namely, the heat dissipation fins 20 adjacent to the heat source area 600) on the basis of the third example, and reduce the number to 16 heat dissipation fins 20, as shown in FIG. 8.

In the simulation experiment, the circuit board module 2 of the first example has densely distributed heat dissipation fins 20 and has no flow guide, and it can be detected that under the architecture of the first example, the highest temperature of the CPU is 61.98° C., the highest temperature of the MOS is 122.66° C., the highest temperature of the choke is 90.84° C., and the highest temperature of the cap is 67.08° C.

Compared with the first example, the circuit board module 2 of the second example provides sparsely distributed heat dissipation fins 20 adjacent to the heating elements 650 to reduce impedance. In addition, in the simulation experiment, it can be detected that under the architecture of the second example, the highest temperature of the CPU is 63.28° C., the highest temperature of the MOS is 121.22° C., the highest temperature of the choke is 84.34° C., and the highest temperature of the cap is 62.54° C. That is, compared with the first example, the highest temperature of the MOS is reduced by 1.17%, the highest temperature of the choke is reduced by 7.15%, and the highest temperature of the cap is reduced by 6.77%. Therefore, the circuit board module 2 of the second example effectively improves the heat dissipation efficiency of the heating elements 650 by reducing the fin number of the first fin group 21 adjacent to the heating elements 650 in the annular radiator 100, thereby increasing the flow rate guided to the heating elements 650.

Compared with the first example, the circuit board module 2 of the third example is additionally provided with the flow guide baffles 200 to control the flow field. In addition, in the simulation experiment, it can be detected that under the architecture of the third example, the highest temperature of the CPU is 61.60° C., the highest temperature of the MOS is 116.40° C., the highest temperature of the choke is 83.40° C., and the highest temperature of the cap is 63.46° C. That is, compared with the first example, under the architecture of the third example, the highest temperature of the CPU is reduced by 0.61%, the highest temperature of the MOS is reduced by 5.1%, the highest temperature of the choke is reduced by 8.2%, and the highest temperature of the cap is reduced by 5.4%. Therefore, the circuit board module 2 of the third example guides the flow field to the heating elements 650 with higher temperature without reducing the area of the heat dissipation fins, thereby reducing the temperature of the heating elements 650 preferentially compared with other electronic elements under the same heat dissipation area. Therefore, the heat dissipation efficiency of the heating elements 650 can be effectively improved.

Compared with the first example, the circuit board module 2 of the fourth example provides sparsely distributed heat dissipation fins 20 adjacent to the heating elements 650 to reduce impedance, and is additionally provided with the flow guide baffles 200 to control the flow field. In addition, in the simulation experiment, it can be detected that under the architecture of the fourth example, the highest temperature of the CPU is 60.14° C., the highest temperature of the MOS is 114.06° C., the highest temperature of the choke is 82.02° C., and the highest temperature of the cap is 60.14° C. That is, compared with the first example, under the architecture of the fourth example, the highest temperature of the CPU is reduced by 2.97%, the highest temperature of the MOS is reduced by 7.01%, the highest temperature of the choke is reduced by 9.71%, and the highest temperature of the cap is reduced by 10.34%. Therefore, the circuit board module 2 of the fourth example combines the characteristics of the circuit board module 2 of the second example and the circuit board module 2 of the third example, that is, reducing the density of the heat dissipation fins 20 adjacent to the heating elements 650 so that the impedance is smaller and the through flow rate is larger. Therefore, the cooling effect is not only superior to that of the first example, but also superior to that of the third example. In addition, since the two flow guide baffles 200 affect the flow field, the temperature of the CPU does not tend to be increased due to the reduction of the total heat dissipation area of the heat dissipation fins 20. Therefore, the heating elements 650 such as the CPU may obtain better heat dissipation performance under the architecture of the fourth example, and the element cost can be reduced.

In addition, in the simulation experiment, in the circuit board module 2 of the fourth example, most of the flow field is concentrated on the heating elements 650, and the flow rate is increased by about 50% due to the design of the heat source area 600 of the lateral opening 670 on the left compared with the first example. This experimental data represents that the heat dissipation system 1 of the fourth example can effectively guide the flow field in the direction of the lateral opening 670, and can concentrate most of the flow field on the heating elements 650, so as to effectively control the flow field in the heat source area 600. Furthermore, the presence of the flow guide baffles 200 results in a number of backflows in the flow field, which in turn increases the flow field pressure difference and makes the flow velocity higher. Therefore, the heat dissipation system 1 or the circuit board module 2 of the fourth example can significantly improve the cooling effect of the heating elements 650, and thus may be applied to the heat dissipation of a specific heating element 650 or to a block where most of the flow field needs to be concentrated for heat dissipation.

Next, the fifth example is to reduce the fin number of the first fin group 21 adjacent to the heat source area 600 to 10 on the basis of the fourth example, as shown in FIG. 9. The sixth example is to increase the fin number of the first fin group 21 adjacent to the heat source area 600 to 22 on the basis of the fourth example, as shown in FIG. 10. The seventh example is to reduce the fin length L1 of the first fin group 21 adjacent to the heat source area 600 to 13.5 mm on the basis of the fourth example, as shown in FIG. 11. The eighth example is to increase the fin length L1 of the first fin group 21 adjacent to the heat source area 600 to 40.5 mm on the basis of the fourth example, as shown in FIG. 12.

Compared with the fourth example, the circuit board module 2 of the fifth example provides more sparsely distributed heat dissipation fins 20 to be adjacent to the heating elements 650, and it can be detected in the simulation experiment that under the architecture of the fifth example, the highest temperature of the CPU is 65.81° C., the highest temperature of the MOS is 114.36° C., the highest temperature of the choke is 85.245° C., and the highest temperature of the cap is 63.08° C. That is, in the case that the total heat dissipation area of the first fin group 21 is significantly reduced, the cooling effect of the heat dissipation system 1 in the fifth example on the heating elements 650 is still superior to that of the first example.

Compared with the fourth example, the circuit board module 2 of the sixth example increases the fin number of the heat dissipation fins 20 adjacent to the heating elements 650, and it can be detected in the simulation experiment that under the architecture of the sixth example, the highest temperature of the CPU is 60.7657° C., the highest temperature of the MOS is 115.06° C., the highest temperature of the choke is 82.611° C., and the highest temperature of the cap is 61.56° C. That is, in the case that the interval I1 between the heat dissipation fins 20 of the first fin group 21 is reduced to increase the impedance relative to the fourth example, the cooling effect of the heat dissipation system 1 in the sixth example on the heating elements 650 is still superior to that of the first example.

Compared with the fourth example, the circuit board module 2 of the seventh example increases the fin length L1 of the heat dissipation fins 20 adjacent to the heating elements 650, and it can be detected in the simulation experiment that under the architecture of the seventh example, the highest temperature of the CPU is 67.452° C., the highest temperature of the MOS is 112.86° C., the highest temperature of the choke is 82.085° C., and the highest temperature of the cap is 60.127° C. That is, compared with the fourth example, under the architecture of the seventh example, the highest temperature of the MOS is reduced by 1.05%, and the highest temperature of the cap is reduced by 0.02%. In other words, the heat dissipation system 1 in the seventh example can further improve the heat dissipation effect of the specific heating element 650. In addition, compared with the first example, the cooling effect of the heat dissipation system 1 in the seventh example on the heating elements 650 is still superior to that of the first example.

Compared with the fourth example, the circuit board module 2 of the eighth example greatly increases the fin length L1 of the heat dissipation fins 20 adjacent to the heating elements 650, and it can be detected in the simulation experiment that under the architecture of the eighth example, the highest temperature of the CPU is 58.727° C., the highest temperature of the MOS is 117.27° C., the highest temperature of the choke is 85.29° C., and the highest temperature of the cap is 61.37° C. That is, compared with the fourth example, under the architecture of the eighth example, the highest temperature of the CPU is reduced by 2.35%. In other words, the heat dissipation system 1 in the eighth example can further improve the heat dissipation effect of the specific heating element 650. In addition, compared with the first example, the cooling effect of the heat dissipation system 1 in the eighth example on the heating elements 650 is still superior to that of the first example.

Therefore, the heat dissipation system 1 can produce different degrees of heat dissipation effects and/or significantly improve the heat dissipation of different heating elements 650 under different structural parameters of the heat dissipation fins 20, whereby fin parameters may be adaptively adjusted according to actual use conditions and requirements to provide desired heat dissipation effects. For example, the heat dissipation system 1 of the eighth example can significantly improve the heat dissipation efficiency of the CPU, while the heat dissipation system 1 of the fourth example can significantly improve the heat dissipation efficiency of the heating elements 650 other than the CPU.

Furthermore, the shapes, sizes, proportions, configurations, and relative distances of elements in the drawings are only schematic, and the positions or orders may be adjusted up and down or exist simultaneously, so as to provide a person skilled in the art with an understanding of the present disclosure, and not to limit the scope of implementation of the present disclosure.

In summary, the annular radiator 100, the heat dissipation system 1, and the circuit board module 2 of any embodiment can provide higher heat dissipation efficiency without increasing the overall size of the radiator. In some embodiments, the heat dissipation system 1 may be applied to the circuit board module 2, and can provide flow field control to effectively guide the flow field to the heat source area 600, thereby providing higher heat dissipation efficiency. In some embodiments, the annular radiator 100 may be applied to the circuit board module 2 and can provide low-flow-resistance heat dissipation fins 20 adjacent to the heat source area 600, so as to increase the flow rate guiding to an element (namely, an airflow channel between two adjacent heat dissipation fins 20), thereby providing higher heat dissipation efficiency. Therefore, the whole module environment may have better heat dissipation effect without increasing the cost. In some embodiments, the annular radiator 100, the heat dissipation system 1, or the circuit board module 2 can design different structural parameters of the heat dissipation fins 20 according to the actual application environment and heat dissipation requirements, so as to obtain better heat dissipation effect. For example, by adding the flow guide baffles 200 and reducing the fin number of the heat dissipation fins 20 adjacent to the heat source area 600, the heat dissipation system 1 can moderately improve the heat dissipation efficiency of the CPU, greatly improve the heat dissipation efficiency of other heating elements 650 other than the CPU, and greatly reduce the system temperature of the circuit board module 2 without changing or reducing the price.

Although the present disclosure has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A heat dissipation system, comprising:
    an annular radiator; and
    two flow guide baffles, each of the flow guide baffles having a connected end and a free end opposite to each other, wherein the connected ends of the two flow guide baffles are connected to the annular radiator, and the two flow guide baffles and the annular radiator surround a heat source area; and
    the heat source area has a lateral opening formed by the free ends of the two flow guide baffles, and located in two sides of the heat source area with the annular radiator respectively.

2. The heat dissipation system according to claim 1, wherein the annular radiator is sandwiched between a fan and a circuit board, and the circuit board in the heat source area is provided with a plurality of heating elements.

3. The heat dissipation system according to claim 2, wherein a distance between the flow guide baffles and the circuit board is greater than or equal to 0 mm and less than or equal to 0.5 mm.

4. The heat dissipation system according to claim 1, wherein the annular radiator comprises:
    a heat conduction body;
    a plurality of heat dissipation fins, arranged radially and connected to a peripheral surface of the heat conduction body; and
    a plurality of heat conduction branches, arranged radially with the plurality of heat dissipation fins and connected to the peripheral surface of the heat conduction body.

5. The heat dissipation system according to claim 4, wherein the plurality of heat dissipation fins is divided into a first fin group and a second fin group by the two flow guide baffles, the first fin group is adjacent to the heat source area, an interval between any two adjacent heat dissipation fins in the first fin group is greater than an interval between any two adjacent heat dissipation fins in the second fin group, and a fin length of the first fin group is greater than a fin length of the second fin group.

6. The heat dissipation system according to claim 4, wherein a fin height of the plurality of heat dissipation fins is smaller than a baffle height of the flow guide baffles.

7. The heat dissipation system according to claim 4, wherein each of the heat conduction branches has a first end and a second end opposite to each other, and the first end of each of the heat conduction branches is connected to the peripheral surface of the heat conduction body.

8. The heat dissipation system according to claim 7, wherein the connected ends of the two flow guide baffles are connected to the second ends of the two heat conduction branches among the plurality of heat conduction branches respectively.

9. The heat dissipation system according to claim 7, wherein the first ends of the two heat conduction branches are connected to opposite sides of the heat conduction body respectively.

10. The heat dissipation system according to claim 4, wherein the plurality of heat dissipation fins is divided into a first fin group and a second fin group by a connecting line of the connected ends of the two flow guide baffles, and the first fin group is adjacent to the heat source area.

11. The heat dissipation system according to claim 10, wherein a total heat dissipation area of the first fin group is smaller than a total heat dissipation area of the second fin group.

12. The heat dissipation system according to claim 11, wherein an interval between any two adjacent heat dissipation fins in the first fin group is greater than an interval between any two adjacent heat dissipation fins in the second fin group.

13. The heat dissipation system according to claim 11, wherein the connected ends of the two flow guide baffles are connected to opposite sides of the annular radiator respectively, and a fin number of the first fin group is smaller than a fin number of the second fin group.

14. The heat dissipation system according to claim 11, wherein a fin length of the first fin group is smaller than a fin length of the second fin group.

15. The heat dissipation system according to claim 11, wherein the total heat dissipation area of the first fin group is smaller than or equal to 80% of the total heat dissipation area of the second fin group.

16. An annular radiator, comprising:
    a heat conduction body; and
    a plurality of heat dissipation fins, arranged radially and connected to a peripheral surface of the heat conduction body, wherein the plurality of heat dissipation fins is divided into a first fin group and a second fin group, and an interval between any two adjacent heat dissipation fins in the first fin group is greater than an interval between any two adjacent heat dissipation fins in the second fin group.

17. The annular radiator according to claim 16, wherein a fin number of the first fin group is smaller than a fin number of the second fin group.

18. The annular radiator according to claim 16, wherein a fin length of each of the heat dissipation fins in the first fin group is equal to a fin length of each of the heat dissipation fins in the second fin group.

19. The annular radiator according to claim 16, wherein the plurality of heat dissipation fins is divided into the first fin group and the second fin group by an extension line perpendicular to and passing through an axis of the heat conduction body.

20. The annular radiator according to claim 16, wherein the annular radiator is sandwiched between a fan and a circuit board, and the circuit board is provided with a plurality of heating elements.

* * * * *